US007137543B2

(12) United States Patent
DeAngelis et al.

(10) Patent No.: US 7,137,543 B2
(45) Date of Patent: Nov. 21, 2006

(54) INTEGRATED FLEXURE MOUNT SCHEME FOR DYNAMIC ISOLATION OF ULTRASONIC TRANSDUCERS

(75) Inventors: Dominick A. DeAngelis, Wayne, PA (US); James E. Eder, Doylestown, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 140 days.

(21) Appl. No.: 10/901,616

(22) Filed: Jul. 28, 2004

(65) Prior Publication Data

US 2006/0022016 A1 Feb. 2, 2006

(51) Int. Cl.
*B23K 1/06* (2006.01)
(52) U.S. Cl. .................. 228/1.1; 228/110.1; 156/580.1
(58) Field of Classification Search .................. 228/1.1, 228/4.5, 110.1, 180.1; 156/580.1, 73.1, 580.2; 310/325, 334, 323.18
See application file for complete search history.

(56) References Cited

U.S. PATENT DOCUMENTS

| | | | | |
|---|---|---|---|---|
| 3,772,538 | A | * | 11/1973 | Supitilov .................... 310/325 |
| 4,173,725 | A | * | 11/1979 | Asai et al. .................... 310/325 |
| 5,364,005 | A | * | 11/1994 | Whelan et al. ............... 228/1.1 |
| 5,469,011 | A | * | 11/1995 | Safabakhsh .................. 310/325 |
| 5,578,888 | A | | 11/1996 | Safabakhsh |
| 5,590,866 | A | * | 1/1997 | Cunningham ................ 248/638 |
| 5,595,328 | A | | 1/1997 | Safabakhsh et al. |
| 5,699,953 | A | | 12/1997 | Safabakhsh |
| 6,056,735 | A | * | 5/2000 | Okada et al. .................... 606/1 |
| 6,073,827 | A | * | 6/2000 | Razon et al. ................. 228/4.5 |
| 6,135,339 | A | | 10/2000 | Parrini |
| 6,719,183 | B1 | | 4/2004 | Kyomasu et al. |

OTHER PUBLICATIONS

Chylak et al.; Achieve Optimal Wire Bonding Performance through Ultrasonic System Improvement; SEMICON © Singapore 2004, pp. 1-7.

* cited by examiner

*Primary Examiner*—Jonathan Johnson
*Assistant Examiner*—Michael Aboagye
(74) *Attorney, Agent, or Firm*—Christopher M. Spletzer, Sr.

(57) ABSTRACT

The present invention is directed to an integrated flexure mount scheme for dynamic isolation of ultrasonic transducers for use with a wire bonding machine. The transducer has a body of a generally elongated shape having front, rear, and main portions. The transducer has mounting flanges for mounting the transducer to the wire bonding machine. The mounting flanges have at least two integrated flexures that connect the mounting flange to the main portion of the transducer body and define at least one flexure orifice.

27 Claims, 6 Drawing Sheets

INTEGRATED FLEXURE MOUNT SCHEME FOR DYNAMIC ISOLATION OF ULTRASONIC TRANSDUCERS

FIELD OF THE INVENTION

This invention is generally directed to ultrasonic transducers used in an ultrasonic bonding apparatus. More specifically, this invention is directed to an integrated flexure mount scheme for dynamic isolation of ultrasonic transducers.

BACKGROUND OF THE INVENTION

In modern wire bonding machines, the ultrasonic system plays a crucial role in determining bond quality. These machines have a transducer, a bonding tool, and an electrical drive circuit. The ultrasonic system affects the energy transfer to the bond under formation. The interconnection formed between the bonding wire and the work-piece device is a critical aspect of the wire bonding process. In the semiconductor field, the integrity of the interconnection is one of the keys to semiconductor device reliability. Ultrasonic bonding has been used in wire bonding for over forty years and the ultrasonic system has been improved over these years to provide faster, more repeatable, and stronger wire bonds.

The ultrasonic system on a wire bonder machine is an ultrasonic generator and a transducer. The ultrasonic generator provides electrical power to the transducer at a given frequency. On state-of-the-art wire bonders, the ultrasonic generator employs a phase lock loop and amplitude control circuitry to provide automatic adjustment to track the changes during wire bonding. The transducer is a piezoelectric resonator that translates electrical energy from the ultrasonic generator into mechanical vibrations that help form the wire bond connection. The transducer, also called the ultrasonic horn, has a clamping mechanism to which the bonding tool is mounted. In ball bonding, the bonding tool is typically a ceramic capillary. The transducer itself has a driver (piezoelectric crystals), an amplifier (tapered body for amplitude amplification), and mounting flanges for mounting the transducer to the bondhead of the wire bonding machine.

Bonding is accomplished by applying an electrical load to the piezoelectric crystals causing ultrasonic vibrations that cause the tapered body of the horn to vibrate in the lengthwise direction (axial direction). At the same time, the ceramic capillary is lowered to contact the work-piece device.

It is known to mount the transducer to the wire bonding machine so that the transducer would be precisely located at a theoretical node point or zero displacement point in relation to its vibrational frequency. At this position, oscillation during the raising and lowering (axial movement) of the tapered body of the ultrasonic horn can be effectively prevented. This zero node mounting would couple the least amount of energy from the piezoelectric crystals into the bonding machine to which the transducer was mounted. Some transducers are manufactured as a unibody design, that is, the mounting flanges and tapered body are one piece. These transducers are limited in that they have only been able to operate at single nodes or harmonics thereof, called fixed-frequency transducers. When such prior art fixed-frequency transducers are driven at multiple frequencies (non-harmonic), several problems arise which have prevented such prior art transducers from being useful at the additional frequencies.

Moreover, even while these fixed-frequency transducers operate at their specific nodes, there is still some portion of their mounting ears that are not positioned at the frequency nodal points. As a result, the transducer mounting ears vibrate and cause energy dissipation. In order to reduce this energy loss in a unibody transducer, the mounting flanges are made extremely thin to stay at the nodal points. If the mounting flanges are too thin, however, there is a corresponding drop in the stiffness of the vibrating horn due to the weak mounting flanges. To solve this problem, a transducer with mounting flanges separate from the transducer body have been employed. Unfortunately, by introducing separate structures to connect the mounting flange to the transducer body, the stiffness of the transducer body is compromised.

What is needed therefore is an ultrasonic transducer suitable for use at multiple ultrasonic frequencies having mounting flanges of sufficient stiffness that do not impede ultrasonic vibrations in the transducer and at the same time prevent vibrations from being transmitted into the machine bond head.

SUMMARY OF THE INVENTION

The present invention is directed to an integrated flexure mount scheme for dynamic isolation of ultrasonic transducers for use with a wire bonding machine. The transducer has a body of a generally elongated shape having front, rear, and main portions. The transducer has mounting flanges for mounting the transducer to the wire bonding machine. The mounting flanges have at least two integrated flexures that connect the mounting flange to the main portion of the transducer body and define at least one flexure orifice.

According to one embodiment, the ultrasonic transducer having an integrated flexure mount scheme has at least two integrated flexures to attach the main portion of the transducer body to the mounting flange. The at least two flexures attached to the main portion of the transducer body are spaced apart at least about 0.25 inches from one another. According to another embodiment, the ultrasonic transducer for a bonding machine operates at a plurality of frequencies. In an exemplary embodiment, at least one of the plurality of operating frequencies is other than a harmonic of another one of the plurality of operating frequencies.

Still a further embodiment of the present invention includes an ultrasonic transducer body of generally elongate shape having front, rear, and main portions. The transducer also has mounting flanges for mounting the transducer body to a bonding machine. Connecting the transducer body and the mounting flanges are four integrated flexures. The four flexures, mounting flange, and main portion of the transducer body define a first substantially longitudinal orifice having a axis substantially parallel to the longitudinal axis of the elongated transducer body also define a second orifice having an axis substantially perpendicular to the longitudinal axis of the elongated transducer body.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1:
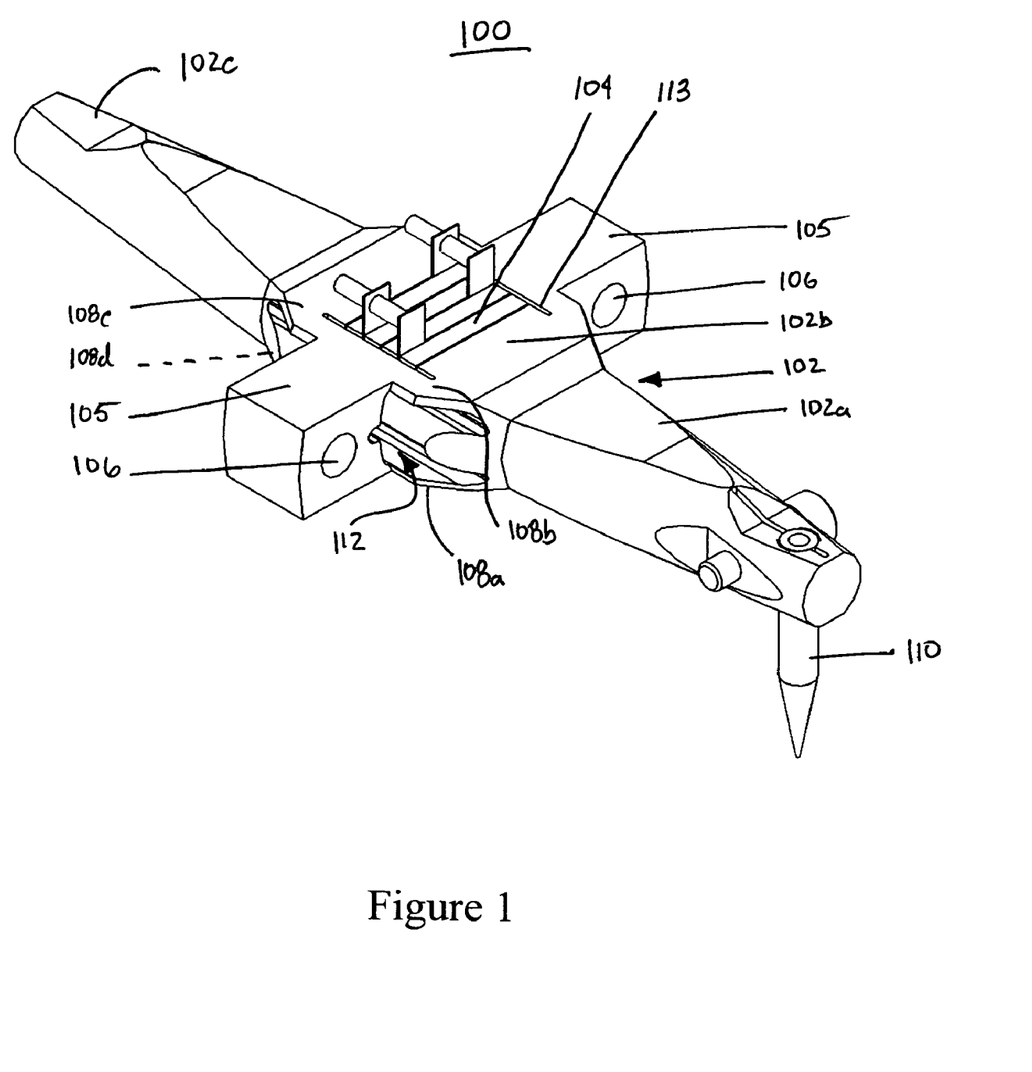
FIG. 1 is a perspective view of a unibody transducer having an integrated flexure mount scheme according to one exemplary embodiment of the present invention.
Figure 5A:
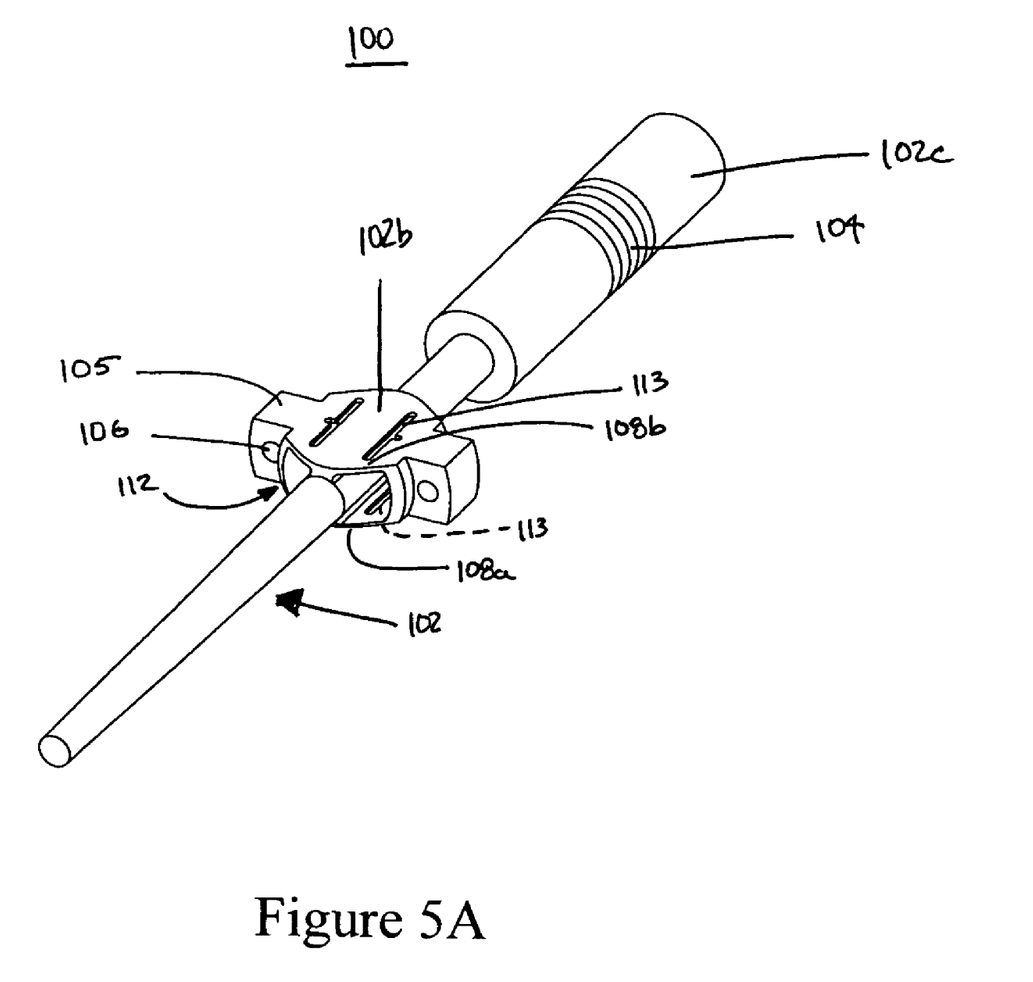
FIG. 5A is a perspective view of another exemplary embodiment of the present invention.
Figure 5B:
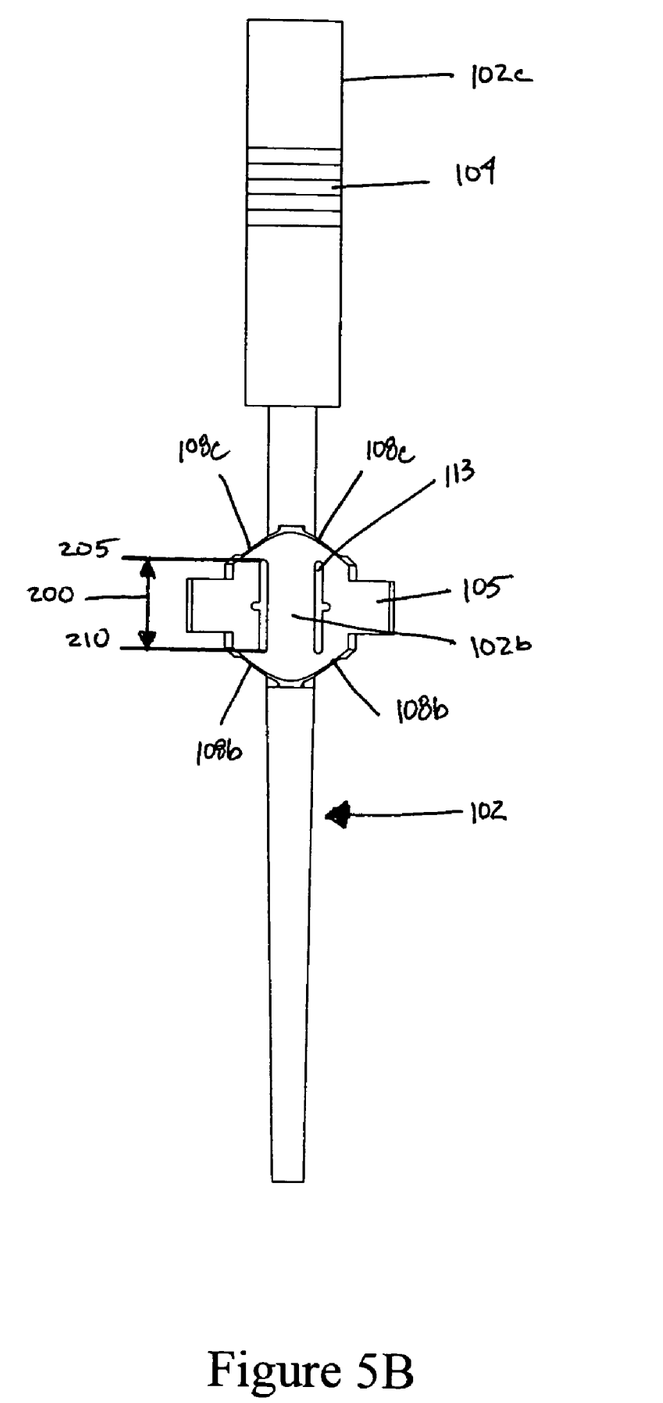
FIG. 5B is a top view of the embodiment of FIG. 5A.

Referring now to the drawing, in which like reference numbers refer to like elements throughout the various figures that comprise the drawing, FIG. 1 shows a perspective view of unibody transducer 100 having an integrated flexure mount according to one embodiment of the present invention. Ultrasonic transducer 100 is comprised of transducer body 102 having a generally elongate shape. Transducer body 102 has front portion 102a to which is mounted capillary 110. At the other end of transducer body 102, is rear portion 102c. Between the front and rear portions of transducer body 102 is main portion 102b. Main portion 102b of transducer body 102 is disposed between mounting flanges 105. Main portion 102b of transducer body 102 contains an aperture adapted to house piezoelectric elements 104. Alternatively, as shown in FIGS. 5A–B, piezoelectric elements 104 may be mounted to rear portion 102c of transducer body 102 by way of an aperture. Piezoelectric elements 104 may be housed in a single aperture or multiple apertures as desired.

At the periphery of main portion 102b are mounting flanges 105. Mounting flanges 105 each have mounting portions disposed on opposite sides of main portion 102b of transducer body 102. Each mounting flange 105 defines aperture 106 formed through its respective mounting portions. Apertures 106 have a longitudinal axis substantially parallel to a longitudinal axis of transducer body 102. In one exemplary embodiment, apertures 106 are mounting holes used to rigidly affix transducer body 102 to the bonding machine (not shown), using well-known attachments, for example bolts.

In the embodiment shown in FIG. 1, main portion 102b of transducer body 102, mounting flange 105, and at least one integrated flexure is formed from a unitary piece of material. The unitary piece of material may be any suitable material such as stainless steel or aerospace grade aluminum for example. In an exemplary embodiment, titanium is used to form transducer body 102.

According to an exemplary embodiment of the present invention, FIG. 1 illustrates an integrated flexure mount scheme for an ultrasonic transducer having at least one flexure per mounting flange. Preferably, the integrated flexure mount scheme has four integrated flexures per mounting flange: upper front 108b, lower front 108a, upper rear 108c and lower rear 108d (not shown in FIG. 1). The flexures are attached to main portion 102b of transducer body 102 at one end, and the other end is attached to mounting flange 105. Both the integrated upper front and rear flexures, integrated lower front and rear flexures, main portion 102b of transducer body 102 and mounting flange 105 define a substantially longitudinal, integrated flexure orifice 112 axial to transducer body 102. A pair of integrated flexures, for example, integrated upper front and rear flexures 108b and 108c, also define slit 113 that extends lengthwise and substantially parallel to the longitudinal axis of transducer body 102. With reference to FIG. 5B, the size of slit 113 is defined in part by integrated upper rear flexure 108c at a point of attachment 205 to main portion 102b of transducer body 102 and integrated upper front flexure 108b at its respective point of attachment 210 to main portion 102b of transducer body 102. Attachments points 205 and 210 define distance 200. Preferably, distance 200 is at least about 0.25 inches.

Figure 2:
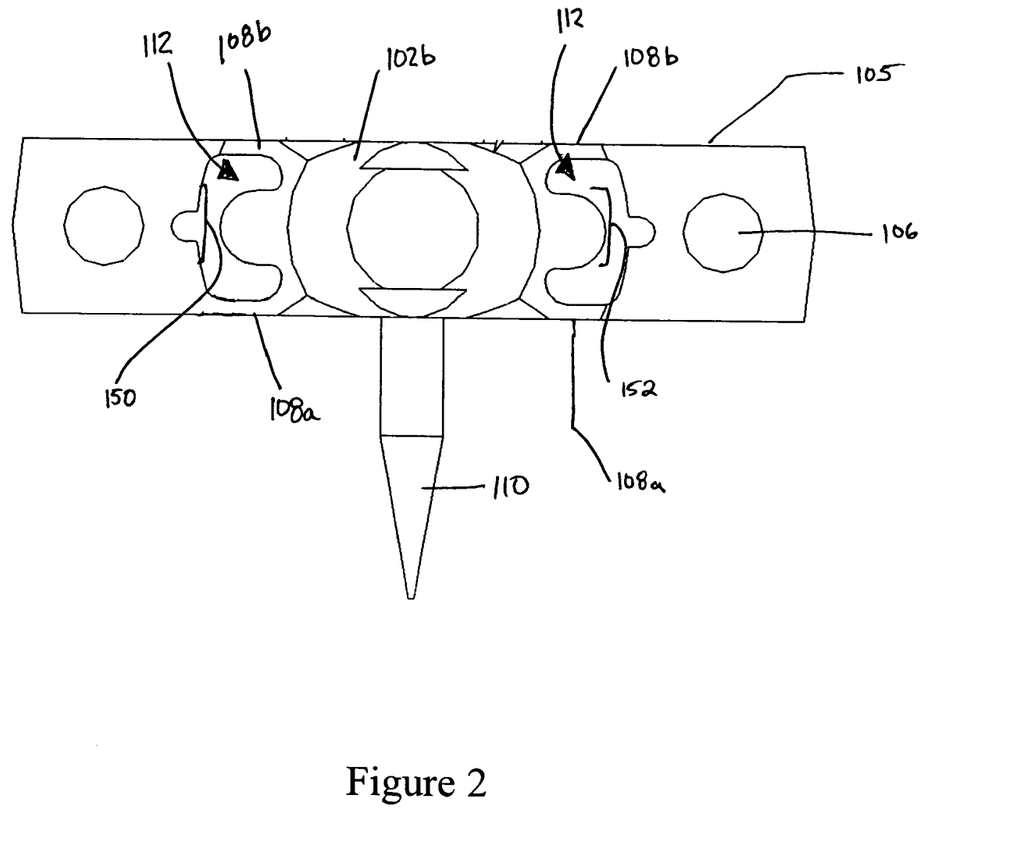
FIG. 2 is a front view of the transducer of FIG. 1.
Figure 3:
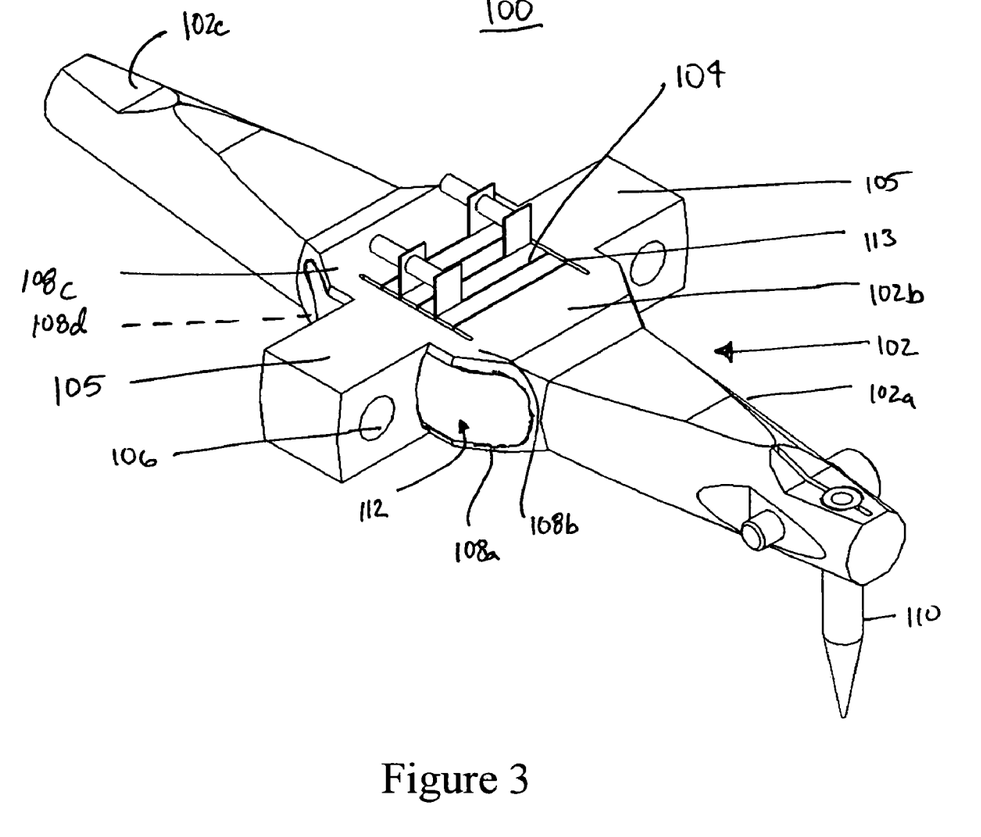
FIG. 3 is a perspective view of the transducer according to another embodiment of the present invention.
Figure 4:
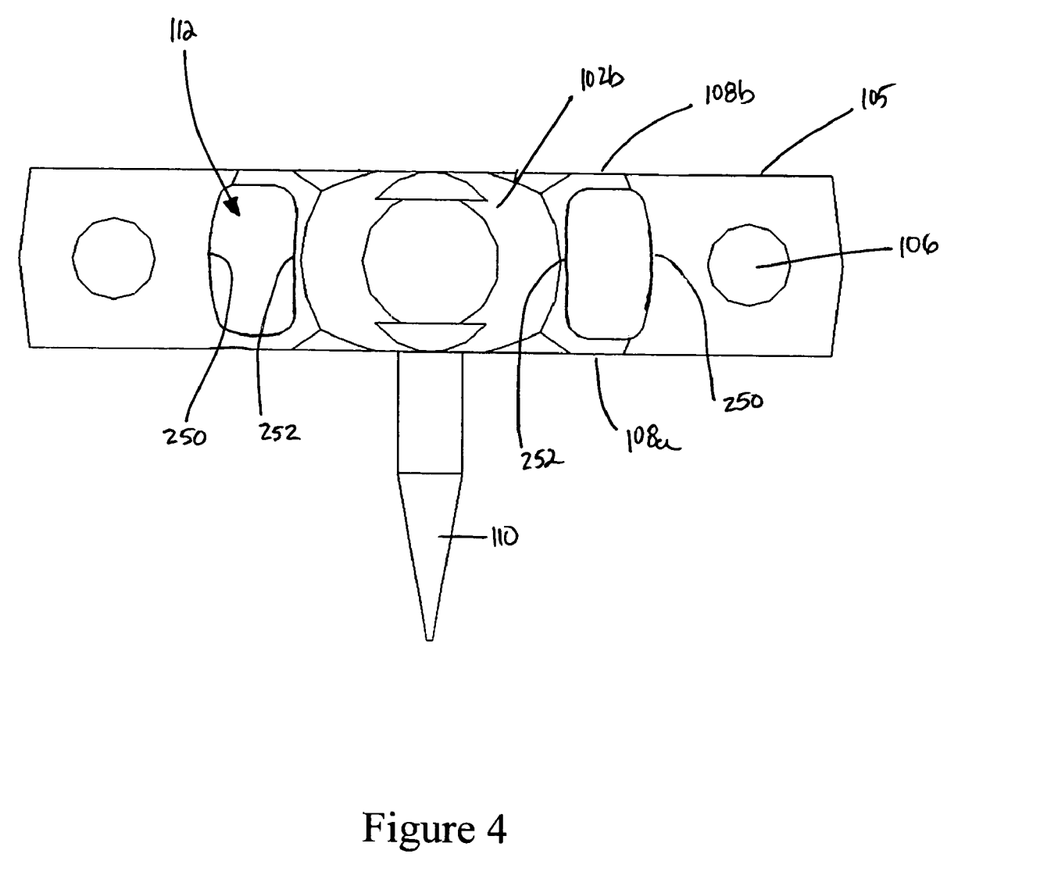
FIG. 4 is a front view of the embodiment shown in FIG. 3.

According to an exemplary embodiment shown in FIGS. 1 and 2, the interior side or profile of integrated flexure orifice 112, defined by mounting flange 105 and indicated by reference numeral 150, may have a different shape than the side of integrated flexure orifice 112 defined by main portion 102b of transducer body 102 and indicated by reference numeral 152. For example, and as shown in FIGS. 3 and 4, the side of integrated flexure orifice 112 defined by mounting flange 105 indicated by reference numeral 250 has a substantially similar shape as the side of integrated flexure orifice 112 defined by main portion 102b of transducer body 102 indicated by reference numeral 252. In other words, the substantially longitudinal flexure orifice may be symmetrical, asymmetrical, or amorphous depending on the tool or tools used to form integrated flexure orifice 112. Likewise, slit 113 extending lengthwise and substantially parallel to the longitudinal axis of transducer body 102 and formed by a pair of front and rear flexures may conform to any shape as defined by the integrated flexures. If more than four integrated flexures are mounted per mounting flange, i.e., more than an upper and lower front and an upper and lower rear flexure, there may be multiple integrated flexure orifices and multiple slits.

The flexures may be of any suitable thickness, but are structured in order to minimize the amount of energy transmitted between transducer body 102 and the bonding machine (not shown). In one exemplary embodiment, the integrated flexures have a thickness of between about 0.005 and 0.030 inches. In another exemplary embodiment, the integrated flexures have a thickness of about 0.015 inches. The inventors have determined that integrated flexures of these types achieve desirable results.

The integrated flexures are used to support transducer body 102 when mounting flange 105 is mounted coincident with a node of the ultrasonic transducer at two diametrically opposed mounting flange points on the bonding machine. In this manner, the integrated flexures provide dynamic isolation of transducer body 102 from mounting flange 105 and the bonding machine when the transducer is operating. This dynamic isolation can be quantified as insensitive to resonant impedance change based upon mounting, as well as the inability to excite parasitic nodes in the mounting support structure.

The exemplary integrated flexure mount scheme described herein provides the necessary static stiffness required for mounting the transducer without significant dynamic interaction at resonance operating nodes. The integrated flexures provide high static bending stiffness via a moderate parallel spacing from the neutral nodal axis. The main portion 102b of transducer body 102 provides independent support for active piezoelectric crystals 104 thereby significantly reducing the sensitivity of the transducer under different mounting conditions, such as found between different bonding machines. Further, because the integrated flexures have a relatively low mass participation in the operating resonant modes, the mounting location to main transducer body 102b is unparticular, allowing the use of multiple operating modes with various nodal locations.

The ultrasonic transducer of the present invention may also operate at a plurality of frequencies. The plurality of frequencies may be more than just harmonics of a single frequency. According to one embodiment of the present invention, the ultrasonic transducer operates at a plurality of frequencies other than a harmonic of another one of the plurality of frequencies. According to a further embodiment of the present invention, the ultrasonic transducer operates at frequencies of about 60 KHz and about 160 KHz. In this regard, the ultrasonic transducer may be mounted by mounting flanges 105 coincident with a node of ultrasonic transducer 100 at each of the plurality of operational frequencies.

FIGS. 5A and 5B illustrate a further exemplary embodiment of the present invention. In FIG. 5A, piezoelectric crystals 104 are mounted within rear portion 102c of elongated transducer body 102 using any well-known means. Mounting flange 105 is attached to main portion 102b of transducer body 102 by means of upper front and lower front integrated flexures 108a and 108b and upper rear and lower rear integrated flexures 108c and 108d. Upper rear flexure 108c and upper front flexure 108b, together with main portion of transducer body 102b, define slit 113 extending lengthwise and substantially parallel to the longitudinal axis of transducer body 102. Front upper flexure 108b and front lower flexure 108a, together with main portion 102b of transducer body 102 and mounting portion 105, define integrated flexure orifice 112 having an axis substantially parallel with the axis of transducer body 102. As in the first exemplary embodiment, the integrated flexures provide isolation of transducer body 102 from the bonding machine.

Although the invention is illustrated and described herein with reference to specific embodiments, the invention is not intended to be limited to the details shown. Rather, various modifications may be made in the details within the scope and range of equivalents of the claims and without departing from the invention.

The invention claimed is:

1. An ultrasonic transducer for use with a bonding machine, comprising:
a transducer body of generally elongate shape having a front, rear, and main portion;
at least one mounting flange for mounting said transducer body to said bonding machine; and
at least two flexures extending between said mounting flange and said main portion of said transducer body,
said main portion, said flexures, and said mounting flange being a single piece formed from a unitary piece of material, such that said main portion, said flexures, and said mounting flange are not separate pieces assembled together.

2. The ultrasonic transducer according to claim 1, wherein said main portion of said transducer body, said mounting flange, and said at least two flexures define a flexure orifice that extends in a direction substantially parallel to an elongate length dimension of the transducer body.

3. The ultrasonic transducer according to claim 1, wherein said material includes at least one of stainless steel, aerospace aluminum, titanium and/or alloys thereof.

4. The ultrasonic transducer according to claim 3, wherein said material is titanium.

5. The ultrasonic transducer according to claim 2 further comprising (1) a second mounting flange disposed adjacent a side of said main portion opposite the mounting flange, and (2) two additional flexures extending between said second mounting flange and said main portion of said transducer body,
said main portion, said additional flexures, and said second mounting flange defining a second flexure orifice, said second flexure orifice extending in a direction substantially parallel to an elongate length dimension of the transducer body.

6. The ultrasonic transducer according to claim 5, wherein said main portion of said transducer body defines an aperture disposed between said mounting flange and said second mounting flange adapted to receive piezoelectric elements.

7. The ultrasonic transducer according to claim 6, wherein said aperture is a single aperture.

8. The ultrasonic transducer according to claim 1, wherein said rear portion of said transducer body is adapted to receive piezoelectric elements.

9. The ultrasonic transducer according to claim 8, wherein said rear portion defines a single aperture adapted to receive said piezoelectric elements.

10. The ultrasonic transducer according to claim 5, wherein each of said mounting flange and said second mounting flange defines respective apertures therethrough, said respective apertures having longitudinal axes substantially parallel to a longitudinal axis of said transducer body.

11. The ultrasonic transducer according to claim 1, wherein said mounting flange is coincident with a node of an operational frequency of said ultrasonic transducer.

12. The ultrasonic transducer according to claim 1, wherein said ultrasonic transducer is configured to operate at a plurality of resonant frequencies.

13. The ultrasonic transducer according to claim 12, wherein at least one of said plurality of resonant frequencies is other than a harmonic of another one of said plurality of resonant frequencies.

14. The ultrasonic transducer according to claim 12, wherein a first one of said plurality of resonant frequencies is about 60 KHz and a second one of said plurality of resonant frequencies is about 160 KHz.

15. The ultrasonic transducer according to claim 12, wherein said mounting flange is coincident with a node of said ultrasonic transducer at each of said plurality of resonant frequencies.

16. The ultrasonic transducer according to claim 1, wherein said at least two flexures comprise a front upper flexure, a front lower flexure, a rear upper flexure, and a rear lower flexure;
and wherein a slit is defined between at least one of said flexures and said main portion of said transducer body, said slit extending lengthwise substantially parallel to a longitudinal axis of said main portion of said transducer body.

17. The ultrasonic transducer according to claim 16, wherein said slit has a length of at least about 0.25 inches.

18. The ultrasonic transducer according to claim 16, wherein each of said flexures have a thickness of between about 0.005 and 0.030 inches.

19. The ultrasonic transducer according to claim 16, wherein each of said flexures have a thickness of about 0.015 inches.

20. The ultrasonic transducer according to claim 16, wherein said flexure orifice has a first interior profile adjacent said mounting flange and a second interior profile adjacent said transducer body, said first profile and said second profile being substantially similar to one another.

21. The ultrasonic transducer according to claim 16, wherein said flexure orifice has a first interior profile adjacent said mounting flange and a second interior profile adjacent said transducer body, said first profile and said second profile being different from one another.

22. An ultrasonic transducer for use with a bonding machine, said transducer comprising:

a transducer body;

a mounting flange for mounting said transducer body to said bonding machine; and at least one flexure extending between said mounting flange and said transducer body, said transducer body, said at least one flexure, and said mounting flange being a single piece formed from a unitary piece of material, such that said transducer body, said at least one flexure, and said mounting flange are not separate pieces assembled together, said ultrasonic transducer being configured to operate at a plurality of frequencies and at least one of said plurality of frequencies is other than a harmonic of another one of said plurality of frequencies.

23. An ultrasonic transducer for use with a bonding machine, comprising:

a transducer body;

a mounting flange for mounting said transducer body to said bonding machine; and at least two flexures adjacent said mounting flange and to said transducer body, the transducer body, the at least two flexures, and the mounting flange being formed from a unitary piece of material, such that said transducer body, said mounting flange, and said at least two flexures are not senarate nieces assembled together, said at least two flexures having a thickness of between about 0.005 and 0.030 inches, wherein said at least two flexures are at least about 0.25 inches from one another.

24. An ultrasonic transducer body having an integrated flexure mount scheme comprising:

a transducer body of generally elongate shape having a front, rear, and main portion;

a first mounting flange and a second mounting flange disposed on opposites sides of said transducer body; and integrated flexures extending between each of said mounting flanges and said main portion of said elongated transducer body, said transducer body, said first mounting flange, said second mounting flange, and said integrated flexures being a single piece formed from a unitary piece of material, such that said transducer body, said first mounting flange, said second mounting flange, and said integrated flexures are not senarate nieces assembled together, wherein said flexures, said mounting flanges, and said main portion of said transducer body define two substantially longitudinal orifices on opposite sides of said transducer body, each of the orifices extending in a direction substantially parallel to a longitudinal axis of said elongated transducer body.

25. The ultrasonic transducer according to claim 1, wherein the main portion defines at least one aperture configured to receive piezoelectric elements of the ultrasonic transducer, the aperture being disposed between at least two of the at least two flexures.

26. The ultrasonic transducer of claim 1 wherein the main portion defines at least one aperture configured to receive piezoelectric elements of the ultrasonic transducer, the ultrasonic transducer comprising two of the mounting flanges, each of the mounting flanges being disposed on opposite sides of the main portion such that the aperture is disposed between the two mounting flanges, and such that at least two of the flexures extend between each of the mounting flanges and the main portion.

27. The ultrasonic transducer of claim 1 wherein the main portion provides support for a plurality of active piezoelectric elements of the transducer, the support provided by the main portion being independent of the mounting flanges.

* * * * *

UNITED STATES PATENT AND TRADEMARK OFFICE
CERTIFICATE OF CORRECTION

| | | |
|---|---|---|
| PATENT NO. | : 7,137,543 B2 | Page 1 of 1 |
| APPLICATION NO. | : 10/901616 | |
| DATED | : November 21, 2006 | |
| INVENTOR(S) | : Dominick A. DeAngelis and Eder James E. | |

It is certified that error appears in the above-identified patent and that said Letters Patent is hereby corrected as shown below:

At Column 7, lines 25-26, "flange, and said at least two flexures are not senarate nieces assembled together." should read --flange, and said at least two flexures are not separate pieces assembled together.-- .

At Column 8, lines 9-10, "integrated flexures are not senarate nieces assembled together." should read --integrated flexures are not separate pieces assembled together.--.

Signed and Sealed this

Fourteenth Day of August, 2007

JON W. DUDAS
*Director of the United States Patent and Trademark Office*